US008362486B2

(12) United States Patent
Abe et al.

(10) Patent No.: US 8,362,486 B2
(45) Date of Patent: Jan. 29, 2013

(54) SOLID STATE IMAGE PICKUP DEVICE AND METHOD OF PRODUCING SOLID STATE IMAGE PICKUP DEVICE

(75) Inventors: Takashi Abe, Kanagawa (JP); Nobuo Nakamura, Kanagawa (JP); Keiji Mabuchi, Kanagawa (JP); Tomoyuki Umeda, Kanagawa (JP); Hiroaki Fujita, Kanagawa (JP); Eiichi Funatsu, Tokyo (JP); Hiroki Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/545,673

(22) Filed: Jul. 10, 2012

(65) Prior Publication Data

US 2012/0286388 A1 Nov. 15, 2012

Related U.S. Application Data

(60) Continuation of application No. 13/064,787, filed on Apr. 15, 2011, which is a continuation of application No. 12/795,442, filed on Jun. 7, 2010, now Pat. No. 8,035,105, which is a continuation of application No. 11/973,562, filed on Oct. 9, 2007, now Pat. No. 7,755,090, which is a continuation of application No. 10/954,788, filed on Sep. 30, 2004, now Pat. No. 7,279,712, which is a division of application No. 10/390,845, filed on Mar. 17, 2003, now Pat. No. 6,821,809.

(30) Foreign Application Priority Data

Mar. 19, 2002 (JP) .................................. 2002-076081

(51) Int. Cl.
*H01L 29/76* (2006.01)

(52) U.S. Cl. .......... 257/69; 257/204; 257/292; 257/432; 257/435; 257/797

(58) Field of Classification Search .................... 257/69, 257/204, 292, 432, 435, 797
See application file for complete search history.

(56) References Cited

U.S. PATENT DOCUMENTS

| | | | |
|---|---|---|---|
| 5,663,555 | A | 9/1997 | Miyawaki et al. |
| 5,712,497 | A | 1/1998 | Watanabe et al. |
| 5,865,699 | A | 2/1999 | Leini |
| 6,040,593 | A | 3/2000 | Park |
| 6,150,676 | A | 11/2000 | Sasaki |
| 6,295,107 | B1 | 9/2001 | Watanabe et al. |
| 6,518,085 | B1 | 2/2003 | Wang et al. |
| 6,690,423 | B1 | 2/2004 | Nakamura et al. |
| 2002/0145688 | A1 | 10/2002 | Sekiguchi |
| 2004/0007722 | A1 | 1/2004 | Narui et al. |

FOREIGN PATENT DOCUMENTS

| | | |
|---|---|---|
| JP | 64-082667 | 3/1989 |
| JP | 01-187858 | 7/1989 |
| JP | 01-291460 | 11/1989 |
| JP | 05-218374 | 8/1993 |
| JP | 07-193205 | 7/1995 |
| JP | 09-045886 | 2/1997 |
| JP | 2000-150846 | 5/2000 |
| JP | 2001-111022 | 4/2001 |

*Primary Examiner* — Long Pham
(74) *Attorney, Agent, or Firm* — Rader, Fishman & Grauer PLLC

(57) ABSTRACT

Forming a back-illuminated type CMOS image sensor, includes process for formation of a registration mark on the wiring side of a silicon substrate during formation of an active region or a gate electrode. A silicide film using an active region may also be used for the registration mark. Thereafter, the registration mark is read from the back side by use of red light or near infrared rays, and registration of the stepper is accomplished. It is also possible to form a registration mark in a silicon oxide film on the back side (illuminated side) in registry with the registration mark on the wiring side, and to achieve the desired registration by use of the registration mark thus formed.

18 Claims, 12 Drawing Sheets

TO S/H, CDS PORTION

F I G. 3
ACTIVE REGION, GATE ELECTRODE (POLYSILICON) AND CONTACT THEREFOR
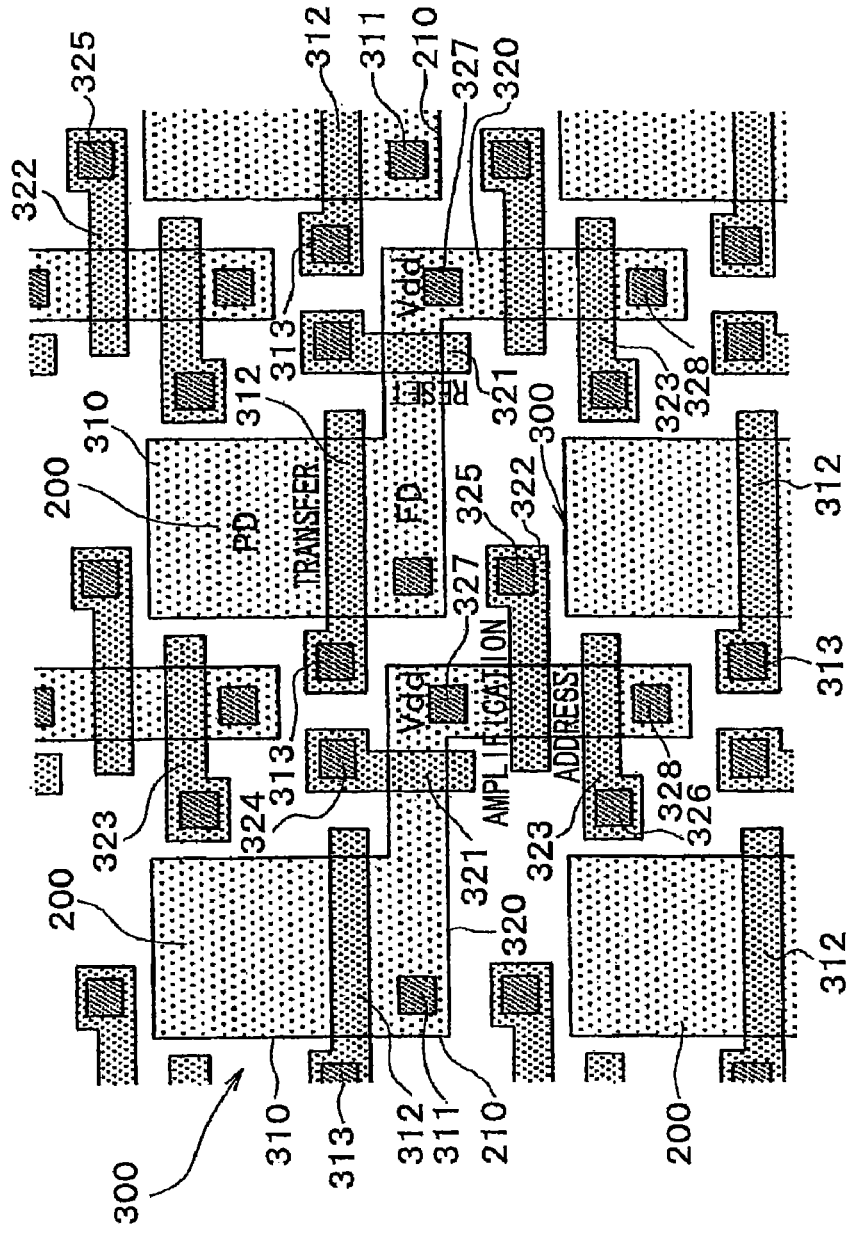

METALLIC WIRING, INTER-WIRING CONTACT, AND ACTIVE REGION

FIG. 7A

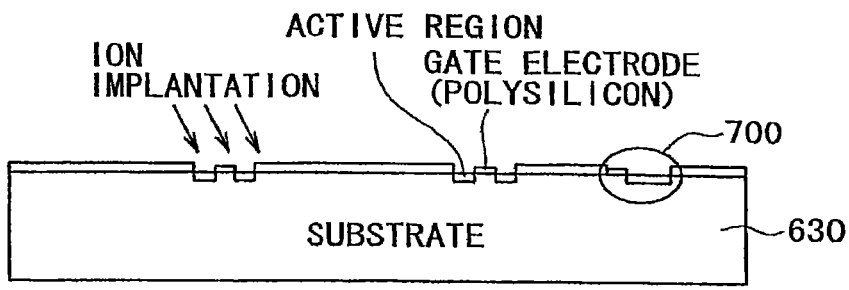

- DEVICE SEPARATION, FORMATION OF GATE ELECTRODE (POLYSILICON), AND ION IMPLANTATION ARE APPLIED TO SURFACE OF SUBSTRATE TO FORM TRANSISTORS, PIXEL ACTIVE REGIONS, RESISTORS AND THE LIKE.
- REGISTER MARK FOR BACK SIDE IS PRELIMINARILY FORMED BY USE OF GATE ELECTRODE (POLYSILICON) OR ACTIVE REGION.

FIG. 7B

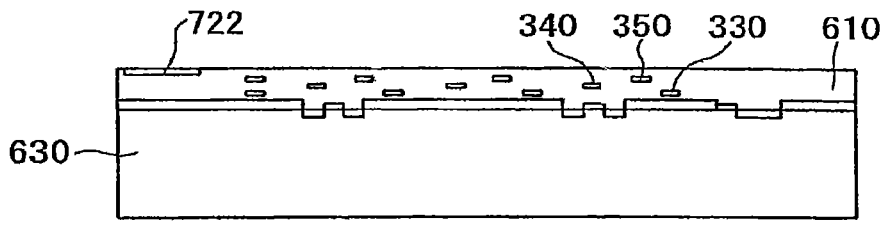

- 1 TO 3AL (INCLUSIVE OF PAD) AND INTER-LAYER FILM ARE FORMED ON SURFACE OF SUBSTRATE.

FIG. 7C

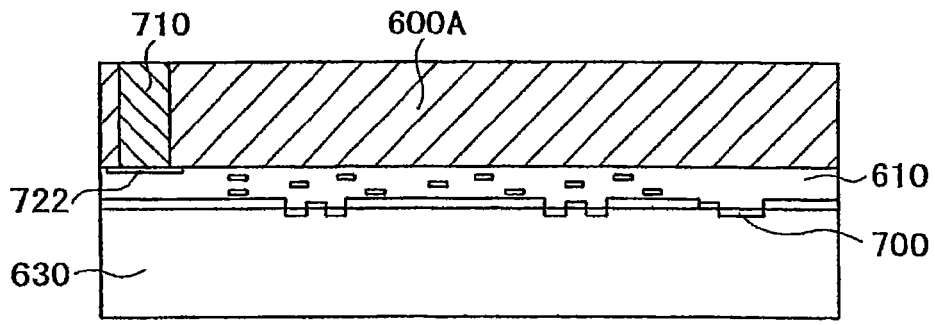

- SUBSTRATE SUPPORT MATERIAL FIRST LAYER (GLASS-RESIN) IS MOUNTED ON UPPER SIDE OF WAFER IN THICKNESS OF SEVERAL HUNDREDS OF μm.
  IN THIS CASE, UPPER SIDE OF PAD IS MASKED WITH RESIST.

● RESIST ON UPPER SIDE OF PAD IS REMOVED.
● SURFACE TREATMENT IS CONDUCTED SO THAT METAL FLOWS INTO BUMP PRODUCED.

● CONDUCTOR IS MADE TO FLOW INTO BUMP OPENED ON PAD AND ONTO SURFACE OF SUBSTRATE SUPPORT MATERIAL.

● METAL ON SURFACE OF SUBSTRATE SUPPORT MATERIAL IS REMOVED, LEAVING THE PORTION ON PAD.

FIG. 9G

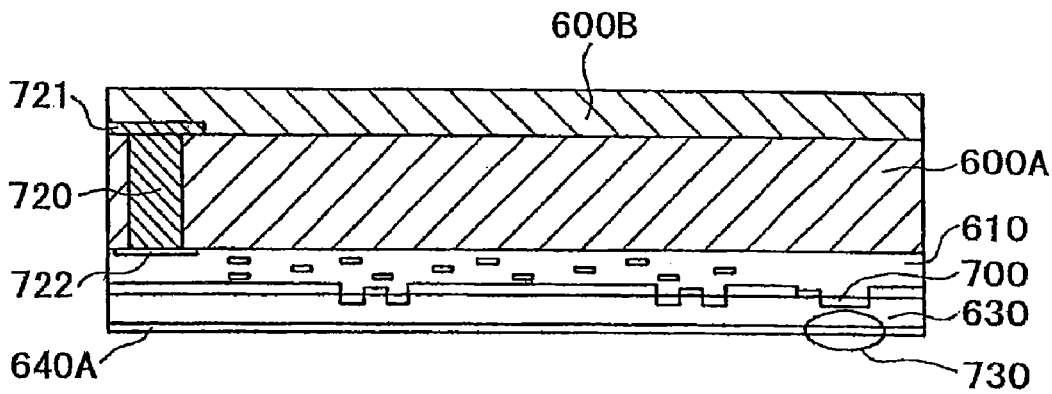

- SUBSTRATE SUPPORT MATERIAL SECOND LAYER IS MOUNTED ON WAFER SURFACE.
  SUBSTRATE IS GROUND AWAY UNTIL THICKNESS BECOMES ABOUT 10 μm.
- $SiO_2$ IS FORMED ON BACK SIDE IN THICKNESS OF 10 nm BY CVD.
- MARK IS FORMED ON BACK SIDE IN REGISTRY WITH GATE ELECTRODE (POLYSILICON) OR ACTIVE LAYER.

FIG. 9H

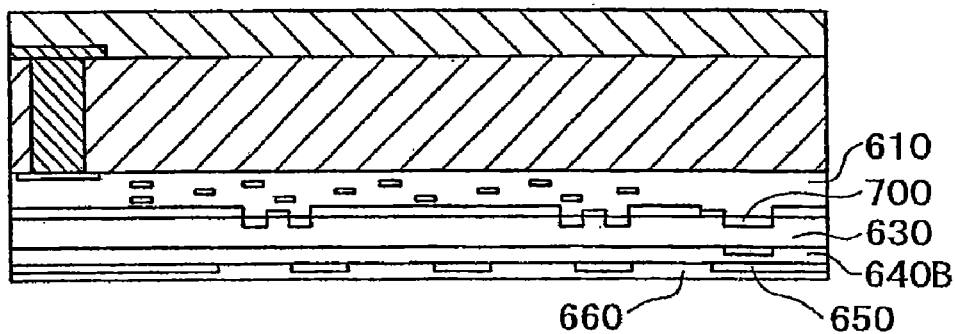

- RESIST IS PLACED IN REGISTRY WITH BACK-SIDE REGISTRATION MARK, AND $P^+$ IS IMPLANTED TO ENTIRE SURFACE ON PIXEL PORTION SO THAT $Si/SiO_2$ INTERFACE IS COVERED WITH HOLES.
- $SiO_2$ IS FORMED ON BACK SIDE IN THICKNESS OF 500 nm BY CVD.
- LIGHT-SHIELDING FILM AND PASSIVATION FILM ARE FORMED IN REGISTRY WITH BACK-SIDE REGISTRATION MARK.

● COLOR FILTER (OCCF) AND ON-CHIP MICRO-LENS (OCL) ARE FORMED IN REGISTRY WITH LIGHT-SHIELDING FILM.

● SUBSTRATE SUPPORT MATERIAL SECOND LAYER ON PAD IS REMOVED, FOR COMPLETION.

※ UPPER SIDE OF SUBSTRATE SUPPORT MATERIAL SECOND LAYER IS POLISHED, AS REQUIRED, FOR FOCUS ADJUSTMENT WITH LENS AND FOR FLATTENING.

SOLID STATE IMAGE PICKUP DEVICE AND METHOD OF PRODUCING SOLID STATE IMAGE PICKUP DEVICE

The subject matter of application U.S. Ser. No. 13/064,787, is incorporated herein by reference. This application is a Continuation of U.S. Ser. No. 13/064,787, filed Apr. 15, 2011; which is a Continuation of U.S. Ser. No. 12/795,442, filed Jun. 7, 2010, now U.S. Pat. No. 8,035,105, issued Oct. 11, 2011; which is a Continuation of U.S. Ser. No. 11/973,562, filed Oct. 9, 2007, now U.S. Pat. No. 7,755,090, issued Jul. 13, 2010; which is a Continuation application of U.S. Ser. No. 10/954,788, filed Sep. 30, 2004, now U.S. Pat. No. 7,279,712, issued Oct. 9, 2007; which is a Divisional application of U.S. Ser. No. 10/390,845, filed Mar. 17, 2003, now U.S. Pat. No. 6,821,809, issued Nov. 23, 2004; which claims priority to Japanese Patent Application Number JP 2002-076081 dated Mar. 19, 2002, which is incorporated herein by reference.

The present invention relates to a Solid State Image Pickup Device and a method of producing a solid state image pickup device for use as various kinds of image sensors and camera modules.

RELATED ART

In recent years, the demand for video cameras and electronic cameras has increased dramatically and these cameras use a CCD type or amplification type solid state image pickup device.

Among these, the amplification type solid state image pickup device (CMOS image sensor) includes on a single semiconductor chip an image pickup pixel portion comprising a plurality of pixels arranged in a two-dimensional form, and a peripheral circuit portion disposed on the outside of the image pickup pixel portion. In each pixel of the image pickup pixel portion, floating diffusion (FD) portion as well as various MOS transistors including a transfer transistor and an amplification transistor are typically provided. In this case, light incident on each pixel is subjected to photo-electric conversion by a photodiode to generate a signal charge, the signal charge is transferred to the FD portion by the transfer transistor, the variation of potential at the FD portion is detected by the amplification transistor, and the detected variation is converted into an electric signal and amplified, whereby signals from each pixel are output through signal wires to the peripheral circuit portion.

In addition, the peripheral circuit portion is provided with a signal processing circuit for applying a predetermined signal processing, for example, CDS (correlative double sampling), gain control, A/D conversion, etc. to the pixel signals from the image pickup pixel portion, and a driving control circuit for controlling the output of the pixel signals by driving each pixel in the image pickup pixel portion, for example, vertical and horizontal scanners, a timing generator (TG), etc.

FIG. 11 is a sectional view showing a device structure in a related-art CMOS image sensor, and shows the structure of one pixel 10 in the image pickup pixel portion and one MOS transistor 20 provided in the peripheral circuit portion.

The pixel 10 in the image pickup pixel portion includes a P type well region 11 on an N type silicon substrate 1, and a photodiode 12 and an FD portion 13 are provided there. A polysilicon transfer electrode 14 for transfer gate for transferring a signal charge from the photodiode 12 to the FD portion 13 is provided in an upper insulating layer 2 of the N type silicon substrate 1, metallic wirings 15 and 16 formed of aluminum or the like are provided on the upper side of the polysilicon transfer electrode 14, and, further, a light-shielding film 17 having a light receiving opening portion for the photodiode 12 is provided on the upper side of the metallic wirings 15 and 16.

In addition, a passivation film 3 comprised of a silicon nitride film or the like is provided on the upper insulating layer 2, and an on-chip color filter 28 and an on-chip micro-lens 19 are provided on the upper side of the passivation film 3.

On the other hand, the MOS transistor 20 in the peripheral circuit portion is provided with a P type well region 21 on the N type silicon substrate 1, and a source region 22 and a drain region 23 are provided there. The upper insulating layer 2 of the N type silicon substrate 1 is provided with a polysilicon gate electrode 24 of the MOS transistor 20, metallic wirings 25, 26 and 27 formed of aluminum or the like are provided on the upper side of the polysilicon gate electrode 24, and, further, a metallic wiring 28 formed of aluminum or the like is provided also in the passivation film 3 on the upper side of the metallic wirings.

In the solid state image pickup device as described above, each pixel is so constructed that in order to enhance the numerical aperture of the photodiode 12 (the ratio of the incident light on the photodiode 12 to the incident light on the pixel), the incident light is condensed on the photodiode 12 through the portion between the wirings by a micro-lens 19.

In this case, however, a part of the light condensed by the micro-lens 19 is repelled by the wirings 15 and 16. This causes the following undesired problems.

(1) Sensitivity is lowered as much as the amount of the light repelled by the wirings.

(2) A part of the light repelled by the wirings enters into the photodiode of the adjacent pixel, resulting in mixture of colors.

(3) Since the layout of the wirings is restricted, characteristics are lowered by the limitations such that the wirings cannot be located on the upper side of the photodiode, or thick wirings cannot be utilized.

(4) Miniaturization is difficult to achieve for the same reason as (3) above.

(5) Since skew incidence of light occurs and the proportion of the light repelled is higher at the pixels in a peripheral area, dark shading occurs more heavily in the peripheral area.

(6) When it is intended to produce the CMOS image sensor by an advanced CMOS process in which the number of the wiring layers is increased further, the distance from the micro-lens to the photodiode is enlarged, and the above difficulties are further increased.

(7) Due to (6) above, the typical advanced CMOS processing techniques cannot be used, correction of the layout of the circuits registered in the library is needed, or the number of the wiring layers is limited and therefore the area is enlarged, so that the cost is raised. Besides, the pixel area per pixel is also increased.

In addition, when long-wavelength light such as red light is subjected to photo-electric conversion in the P type well region 11 deeper than the photodiode 12, the electrons generated diffuse into the P type well region 11, resulting in that the electrons enter into the photodiode 12 located at another position to cause miring of colors. When the electrons enter into a pixel light-shielded for detection of black, the black level is detected erroneously.

Besides, while there is a process in which a silicide is used for the active region, the silicide hampers the incidence of light, so that a process of removing only, the silicide on the photodiode 12 must be added.

Therefore, the number of steps is increased, and the process becomes complicated. In addition, defects in the photodiode arise from the steps, also.

Furthermore, such functions as a camera signal processing circuit and a DSP which have hitherto been composed of other chips are mounted on the peripheral circuit portion of the CMOS image sensor, as described above. As to these, since the process generation is advanced in the manner of 0.4 µm→0.25 µm→0.18 µm→0.13 µm, the CMOS image sensor itself must be made to correspond to these new processes; if it is not fulfilled, the merits of miniaturization cannot be offered and the abundant library and knowledge of CMOS circuits cannot be utilized.

However, the number of layers in the wiring structure increases as the process generation advances. For example, while three wiring layers are used in the 0.4 µm process, eight wiring layers are used in the 0.13 µm process. In addition, the thickness of the wiring layer is also increased, and the distance from the micro-lens to the light receiving surface of the photodiode is increased by a factor of 3 to 5.

Therefore, in the related-art method in which the light is passed to the light-receiving surface through the wiring layers, it has come to be impossible to efficiently condense the light onto the light-receiving surface of the pixel, and the problems of (1) to (7) above have come to be conspicuous.

Meanwhile, recently, the so-called back-illuminated type solid state image pickup device in which the light-receiving surface of the photodiode is provided on the back side of a semiconductor chip has been proposed as a solid state image pickup device other than the above-mentioned CMOS image sensor.

This device is constructed as a frame transfer type CCD image pickup device, in which a silicon substrate is made to be a thin film, transfer electrodes and the like are provided on the face side of the thin film, and the light-receiving surface of the photodiode is disposed on the back side.

Then, the light received by the light-receiving surface is subjected to photo-electric conversion by the photodiode in the silicon substrate, and signal charges are trapped by a depletion layer extending from the substrate face side, are accumulated in a potential well (P+ type well region) on the face side, and transferred and outputted.

FIG. 12 is a sectional view showing the device structure of a photodiode portion in such a back-illuminated type solid state image pickup device.

The solid state image pickup device has a structure in which an epitaxially grown N type well region 31 is provided on a thin film type P− type silicon substrate 30, and a P+ type well region 33 is provided on the upper side of the N type well region 31 through a depletion layer 32 therebetween to compose a photodiode.

Moreover, an oxide film 34 and an aluminum light-shielding film 35 are provided on the P+ type well region 33.

In addition, the side of the P− type silicon substrate 30 is the back side, i.e., the light-illuminated side, and the side of the oxide film 34 and the aluminum light-shielding film 35 is the face side, where wirings for transfer electrodes, for example, and the like are disposed.

However, the image pickup device with such a structure has the problem the sensitivity for blue color for which absorptivity is high is lowered. In addition, since light is incident on the back side and is subjected to photo-electric conversion at a shallow position, the signal charges generated diffuse and, in a proportion, would enter into the photodiodes in the surroundings.

On the other hand, in the case of the CCD type image pickup device, it is needless to enlarge the height of the wiring layer since system-on-chip is not adopted, and the light-shielding film can be dropped into the surroundings of the photodiode since a process peculiar to CCD is adopted, so that condensation of light by an on-chip lens is easy to achieve. Therefore, in the case of the CCD type image pickup device, the above-mentioned problems (1) to (7) encountered in the case of the CMOS image sensor are not generated.

From the above circumstances, the back-illuminated type CCD type image pickup device has almost not been put to practical use, and such a back-illuminated type CCD image pickup device in which color filters and micro-lenses are in an on-chip form are not typically utilized.

In contrast, in the case of the CMOS image sensor, a process obtained by slight correction to a standard CMOS process is used. Therefore, the CMOS image sensor has the merit which is not possessed by the CCD type image pickup device, such that, by adopting the above-mentioned back-illuminated type, a newest process can always be used without being influenced by the wiring step.

In addition, the structure in which a number of layers of metallic wirings extend in crossing directions is absent in the case of the CCD type image pickup device. Therefore, different from the case of the CCD type image pickup device, the above-mentioned problems (1) to (7) are conspicuous particularly in the case of the CMOS image sensor. From this point of view, also, adoption of the back-illuminated type for the CMOS image sensor is advantageous.

However, on one hand, at the time of forming color filters and on-chip micro-lenses on a wafer of an ordinary CMOS image sensor, registration (positioning) of a stepper is conducted by use of the metallic wiring layer formed of aluminum or the like. On the other hand, at the time of producing the back-illuminated type CMOS image sensor, after the wiring step for the wafer is completed, the wafer is inverted face side back, the side opposite to the side where the wiring is provided is polished, then formation of a silicon oxide film (SiO$_2$), formation of a light-shielding film and formation of a passivation film are conducted, and thereafter formation of back-side color filters and back-side micro-lenses is conducted.

Therefore, in the case of producing the back-illuminated type CMOS image sensor, there is the problem that the registration mark formed at the time of producing the aluminum wiring layer cannot be used as it is as in a related art.

Accordingly, it is an object of the present invention is to provide a method of producing a solid state image pickup device in which various kinds of registrations at the time of producing the so-called back-illuminated type amplification type solid state image pickup device (CMOS image sensor) can be provided easily and appropriately, and production efficiency and device accuracy can be improved.

SUMMARY OF THE INVENTION

In order to attain the above object, according to the present invention, there is provided a method of producing a solid state image pickup device comprising a semiconductor substrate provided with an image pickup pixel portion in which a plurality of pixels each comprising a photo-electric conversion device and a field effect transistor are arranged in a two-dimensional array. A peripheral circuit portion comprising a driving circuit for driving the image pickup pixel portion and a signal processing circuit for processing a pixel signal outputted from the image pickup pixel portion, and a wiring layer, are also provided on a first side of the semiconductor substrate. The peripheral drive circuit is used for driving the field effect transistors in the image pickup pixel portion. A light-receiving surface of the photo-electric conversion device is formed on a second side of the semiconductor substrate, wherein a registration mark is formed by use of an active region or a gate layer for the field effect transistors arranged on the first side of the semiconductor substrate, and registration of each device on the second side in the subsequent step is achieved by use of the registration mark.

In accordance with the method of producing a solid state image pickup device of the present invention, the registration mark is formed by using the active region or the gate layer for the field effect transistors arranged on the wiring side (first side) opposite to the illuminated side of the semiconductor substrate, whereby the registration for each device on the second side which has been difficult to achieve by use of a metallic wiring layer as in the related art can be achieved by detecting the registration mark formed on the first side of the semiconductor substrate through the thin film semiconductor substrate.

Therefore, the desired positioning and registration for each device can be conducted easily and appropriately, without applying any special registration means to the second side of the semiconductor substrate, and production efficiency and device accuracy can be significantly improved.

Also, there is provided a solid state image pickup device comprising a substrate, a first alignment mark formed on a first surface of said substrate, a micro-lens formed on a second surface of said substrate, wherein said alignment mark is formed only on a surface portion of said first surface, and wherein a position of said micro-lens has a constant relationship with that of said alignment mark.

Further, there is provided a solid state image pickup device comprising a photo-electric conversion region, a MOS transistor formed on a first surface of a substrate, wherein said photo-electric conversion region is comprised of a first impurity region of a first conductivity type formed on a second surface of said substrate, a second impurity region of a second conductivity type formed on said first impurity region and a third impurity region of said first conductivity type formed on said second impurity region, and wherein said MOS transistor is comprised of a first well of said first conductivity type and a source and a drain regions of said second conductivity type formed in said first well.

BRIEF DESCRIPTION OF THE DRAWINGS

FIG. 3—is a general plan view showing a concrete example of pixel layout in the back-illuminated type CMOS image sensor shown in FIG. 1;

FIGS. 7(A), 7(B), and 7(C)—show sectional views showing a production process of the back-illuminated type CMOS image sensor shown in FIG. 1;

FIGS. 9(G) and 9(H)—show sectional views showing the production process of the back-illuminated type CMOS image sensor shown in FIG. 1;

DESCRIPTION OF THE PRESENTLY PREFERRED EMBODIMENTS

Now, an exemplary embodiment of the method of producing a solid state image pickup device according to the present invention will be described below.

According to the present exemplary embodiment, in the step of producing a back-illuminated type solid state image pickup device for coping with a new generation of process, a registration mark is formed on the wiring side by diverting an active region or a gate electrode (polysilicon film) for use in the step of forming a MOS transistor, for example, in order to conduct registration for a stepper.

In addition, in order to form the registration mark, a silicide film used at the active region may also be used, and the silicide film may be left on photodiodes (on the side opposite to the illuminated side).

Thereafter, registration of the stepper is conducted by reading the registration mark with red light or near infrared rays from the back side.

Incidentally, it is possible to form a registration mark on a silicon oxide film on the back side (illuminated side) in conformity with the registration mark on the wiring side and to conduct registration by use of this mark.

Accordingly, the back-illuminated type amplification type solid state image pickup device (CMOS image sensor) can be easily produced, and the above-mentioned problems as to condensation of light and the like can be solved. First, an outline of the CMOS image sensor according to the present embodiment will be described.

Figure 1:
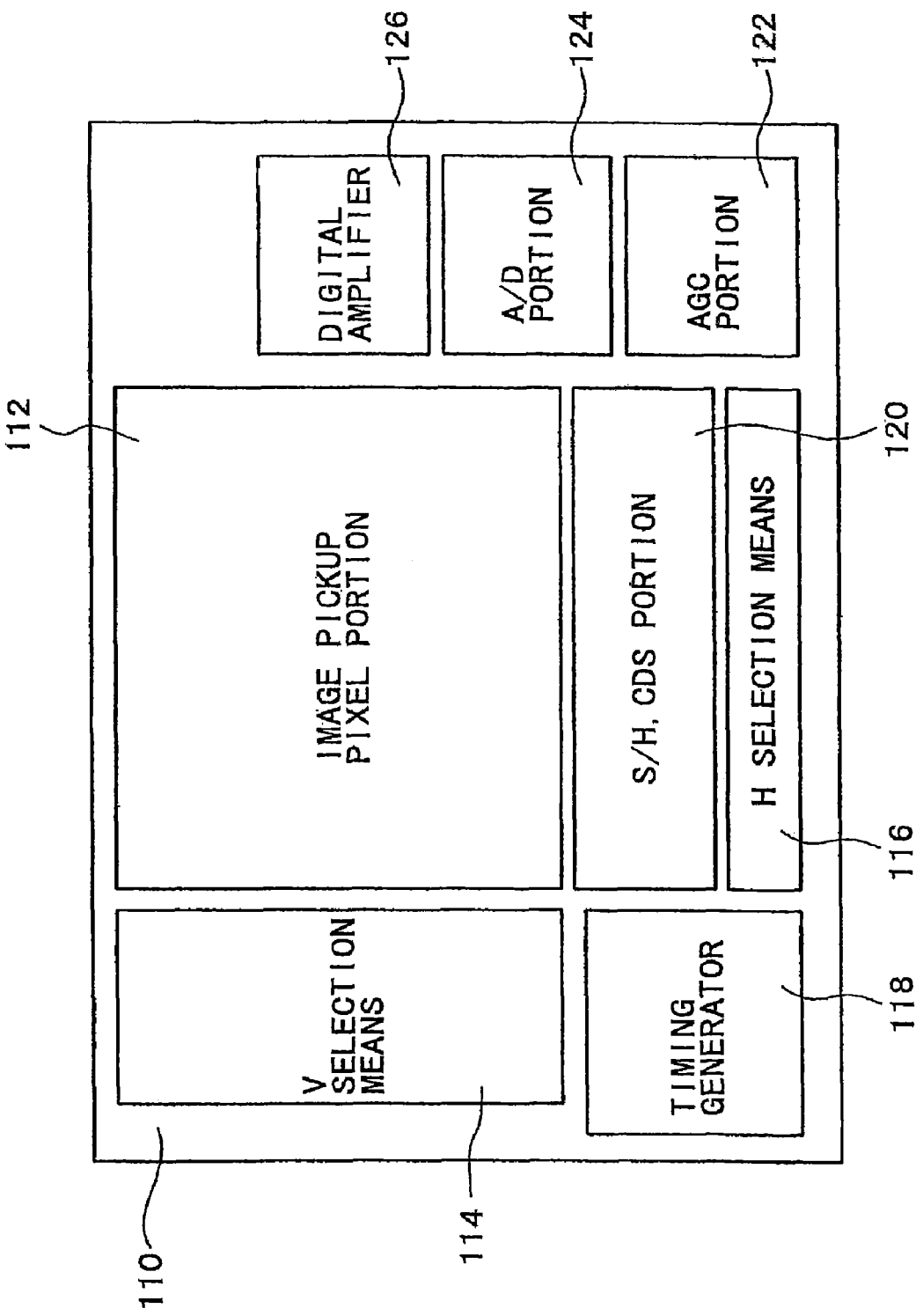
FIG. 1—is a plan view showing schematically an outline of a back-illuminated type CMOS image sensor according to an embodiment of the present invention.
Figure 2:
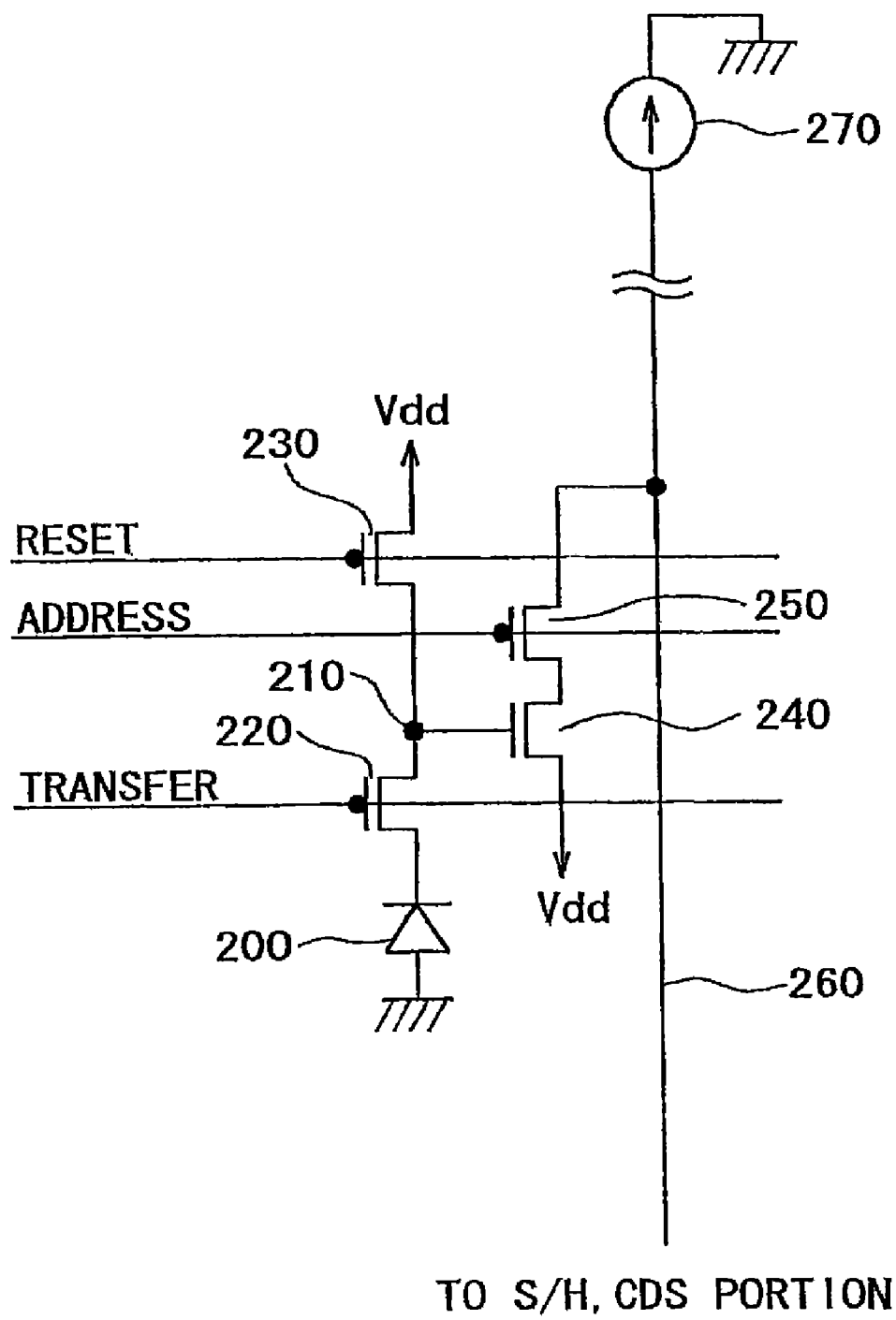
FIG. 2—is an equivalent circuit diagram showing the constitution of a pixel in the back-illuminated type CMOS image sensor shown in FIG. 1.

FIG. 1 is a plan view showing schematically the outline of the CMOS image sensor according to the present embodiment, and FIG. 2 is an equivalent circuit diagram showing the constitution of the pixel in the CMOS image sensor shown in FIG. 1.

The CMOS image sensor according to the exemplary embodiment includes an image pickup pixel portion 112, a V selection means 114, an H selection means 116, a timing generator (TG) 118, an S/H☐CDS portion 120, an AGC portion 122, an A/D portion 124, a digital amplifier portion 126 and the like which are formed on a semiconductor chip 110.

The image pickup pixel portion 112 includes a multiplicity of pixels arranged in a two-dimensional matrix form. As shown in FIG. 2, each pixel is provided with a photodiode (PD) 200 which is a photo-electric conversion device for generating a signal charge according to the amount of light received and accumulating the signal charge, and further with four MOS transistors, namely, a transfer transistor 220 for transferring the signal charge converted and accumulated by the photodiode 200 to a floating diffusion portion (FD portion) 210, a reset transistor 230 for resetting the voltage of the FD portion 210, an amplification transistor 240 for outputting an output signal corresponding to the voltage of the FD portion 210, and a selection (address) transistor 250 for outputting the output signal from the amplification transistor 240 to a vertical signal conductor 260.

In the pixel thus constituted, the signal charge having undergone photo-electric conversion by the photodiode 200 is transferred to the FD portion 210 by the transfer transistor 220. The FD portion 210 is connected with a gate of the amplification transistor 240, and the amplification transistor 240 constitutes a source follower together with a fixed current source 270 provided in the outside of the image pickup pixel portion 112. Therefore, when the address transistor 250 is turned ON, a voltage according to the voltage of the FD portion 210 is output to the vertical signal conductor 260.

In addition, the reset transistor 230 resets the voltage of the FD portion 210 to a fixed voltage (in the embodiment shown, a driving voltage Vdd) independent from the signal charge.

Besides, the image pickup pixel portion 112 includes various kinds of driving wirings for controlling the driving of each MOS transistor which are wired in the horizontal direction. The pixels in the image pickup pixel portion 112 are sequentially selected in the vertical direction on a horizontal line (pixel row) basis by the V selection means 114, and the MOS transistors in the pixels are controlled by various pulse signals, from the timing generator 118, whereby the signals of the pixels are read by the S/H☐CDS portion 120 through the vertical signal conductor 260 on a pixel column basis.

The S/H☐CDS portion 120 includes S/H☐CDS circuits on the basis of each pixel column in the image pickup pixel portion 112, and applies signal processing such as CDS (correlative double sampling) to the pixel signals read from each pixel column in the image pickup pixel portion 112. In addition, the H selection means 116 outputs pixel signals from the S/H☐CDS portion 120 to the AGC portion 122.

The AGC portion 122 applies predetermined gain control to the pixel signal from the S/H☐CDS portion 120 selected by the H selection means 116, and outputs the pixel signal to the A/D portion 124.

The A/D portion 124 converts the pixel signal from the AGO portion 122 from an analog signal to a digital signal, and outputs the digital signal to the digital amplifier 126. The digital amplifier 126 performs necessary amplification and buffering as to the digital signal output from the A/D portion 124, and outputs the resulting signal from an external terminal which is not shown.

In addition, the timing generator 118 supplies various timing signals also to other portions than the pixels in the image pickup pixel portion 112 described above.

Figure 4:
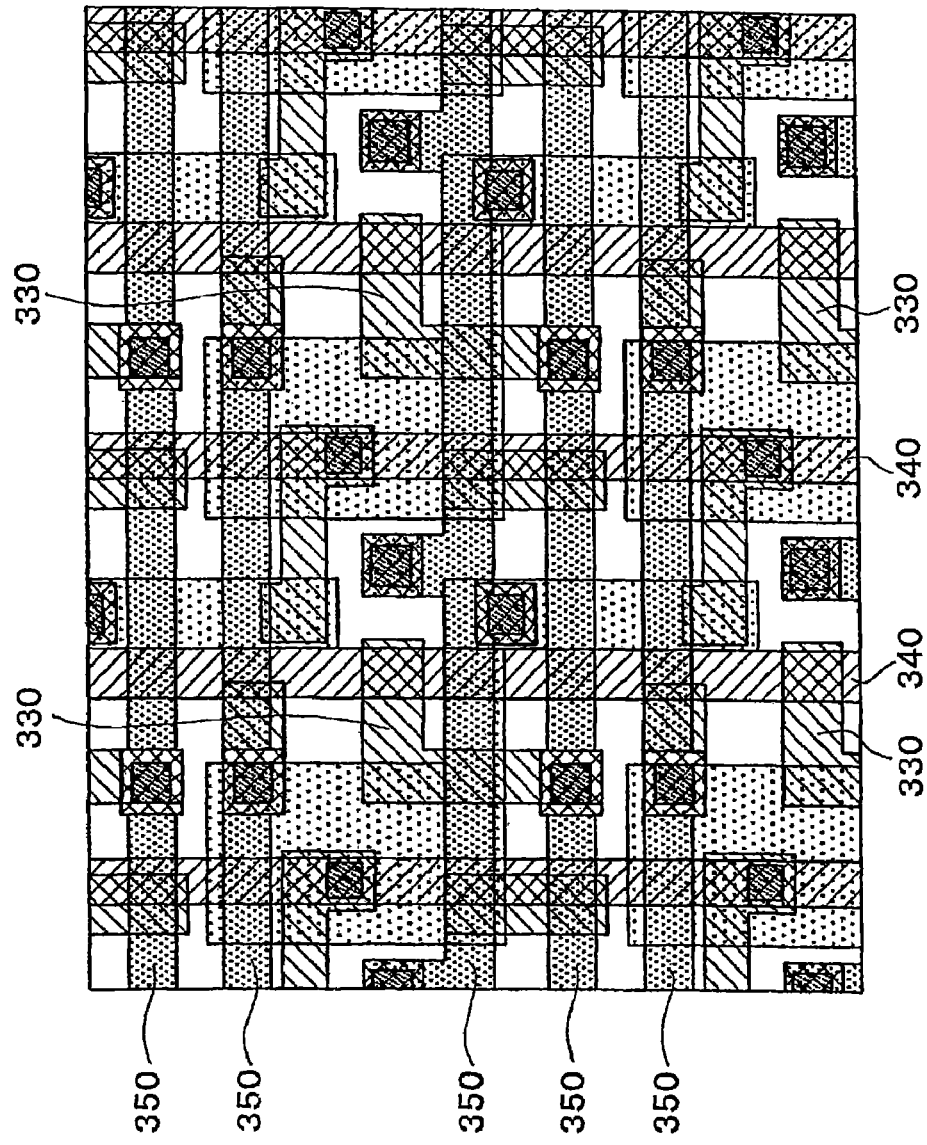
FIG. 4—is a general plan view showing a concrete example of pixel layout in the back-illuminated type CMOS image sensor shown in FIG. 1.

FIGS. 3 and 4 are general plan views showing a concrete example of pixel layout in the CMOS image sensor according to the present embodiment.

First, FIG. 3 shows the layout of the active regions (the regions where a gate oxide film is disposed) of the photodiode and each transistor, gate electrodes (polysilicon film), and contacts therefor.

As shown in the figures, the active region 300 of each pixel is comprised of a rectangular region 310 comprising the above-mentioned photodiode (PD) 200 and FD portion 210, and a bent belt form region 320 extended in an L shape from one corner of the rectangular region 310.

A contact 311 is provided at the FD portion 210 in the rectangular region 310, a transfer gate electrode 312 is provided at an intermediate location between the photodiode (PD) 200 and the FD portion 210, and a contact 313 is provided at an end portion of the transfer gate electrode 312.

A reset gate electrode 321, an amplification gate electrode 322 and an address gate electrode 323 are provided in this order in the bent belt form region 320, and contacts 324, 325 and 326 are provided respectively at end portions of the gate electrodes 321, 322 and 323. The contact 311 for the FD portion 210 and the contact 325 for the amplification gate electrode 322 are connected to each other by an in-pixel metallic wiring.

In addition, a contact 327 connected to the Vdd for resetting is provided between the reset gate electrode 321 and the amplification gate electrode 322, and a contact 328 connected to the vertical signal conductor 260 is provided at an end portion of the bent belt form region 320.

In addition, FIG. 4 shows the metallic wirings in the upper layers than those in FIG. 3 and contacts between the metallic wirings, together with active regions. In the present embodiment, the metallic wirings are provided in three layers, in which the first layer is used as an in-pixel wiring 330, the second layer is used as a wiring 340 in the longitudinal (vertical) direction, and the third layer is used as a wiring 350 in the crosswise (horizontal) direction.

These metallic wirings 330, 340 and 350 have hitherto been disposed aloof from the photodiode regions; here, they are disposed also on the upper side of the photodiodes (namely, on the side opposite to the illuminated side). It is clear that by the related-art wiring method in which the wirings are aloof from the photodiodes, the pixels with the size as shown in the figure cannot be laid out.

Figure 5:
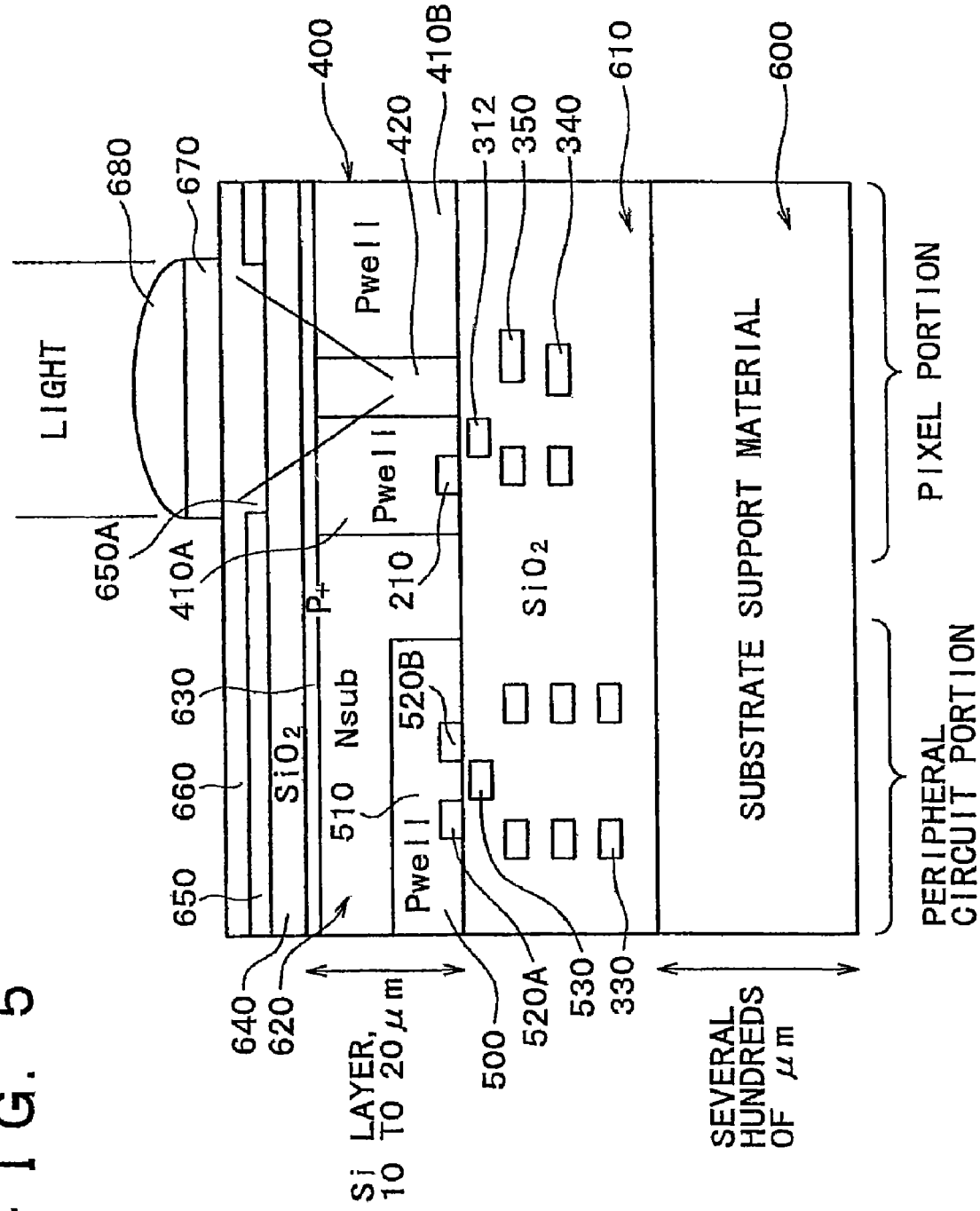
FIG. 5—is a sectional view showing the device structure in the back-illuminated type CMOS image sensor shown in FIG. 1.

FIG. 5 is a sectional view showing the device structure in the back-illuminated type CMOS image sensor according to the present embodiment, and shows the structure of one pixel 400 in the image pickup pixel portion and one MOS transistor 500 provided in the peripheral circuit portion. Incidentally, in FIG. 5, the upper side in the figure is the illuminated side (back side), and the lower side is the wiring side (face side).

The CMOS image sensor includes the above-mentioned three metallic wirings 330, 340 and 350 provided in the inside of a silicon oxide film layer 610 provided on a substrate support material (glass-resin or the like) 600, and the above-mentioned pixel 400 and MOS transistor 500 are provided in a silicon layer (N type silicon substrate) 620 provided on the silicon oxide film layer 610.

Incidentally, FIG. 5 shows a general constitution, and general points of the device structure will be described here; the details will be described later, referring to FIG. 6.

The pixel 400 has a structure in which a photodiode 420 is provided in the state of piercing through the silicon layer 620, at an intermediate portion between P type well regions 410A and 410B provided in the state of piercing through the silicon layer 620.

The above-mentioned FD portion 210 is provided in the P type well region 410A on one side, and the above-mentioned transfer gate electrode 312 is provided in the inside of the silicon oxide film layer 610 located at an intermediate position between the photodiode 420 and the FD portion 210.

In addition, the MOS transistor 500 has a structure in which a P type well region 510 is provided in the region on the silicon oxide film layer 610 side of the N type silicon layer 620, source/drain (S/D) 520A and 520B are provided in the P type well region 510, and a gate electrode (polysilicon film) 530 is provided on the side of the silicon oxide film layer 610.

In addition, a P+ type region 630 is provided on the N type silicon layer 620, and a silicon oxide film ($SiO_2$) 640 is provided on the upper side thereof. Further, a light-shielding film 650 formed of aluminum or the like is provided on the upper side of the silicon oxide film 640, and the light-shielding film 650 is provided with an opening portion 650A corresponding to a light-receiving region of the photodiode 420.

Incidentally, though not shown in the figure, a pixel for detection of black level is formed in the same device structure as the pixel 400 shown in FIG. 5, but the opening portion 650A of the light-shielding film 650 is not formed in the light-receiving region so that a signal charge in the state of being free of light reception is outputted as a black level reference signal.

In addition, a silicon nitride film (SiN) 660 as a passivation layer is provided on the upper side of such a light-shielding film 650, and, further, on the upper side of this, a color filter 670 and a micro-lens 680 are disposed in an on-chip structure in a region corresponding to the image pickup pixel portion.

Incidentally, the wafer constituting such a CMOS image sensor is polished by CMP (chemical mechanical polishing) so that the portion of the silicon layer 620 is reduced in film thickness to about 10 μm, for example.

In view of frequency characteristics of light, a desirable film thickness range is 5 to 15 μm for visible rays, 15 to 50 μm for infrared rays, and 3 to 7 μm for ultraviolet region.

Besides, the light-shielding film 650, unlike the wirings, can be laid out by taking only optical elements into account. The metallic layer present in the range from the micro-lens 680 to the photodiode 420 is only the light-shielding film 650, and the height of the light-shielding film 650 from the photodiode 420 is as small as the thickness of the silicon oxide film 640, for example, about 0.5 μm; therefore, unlike the above-mentioned related-art example, the restrictions on light condensation due to repelling by the metallic wirings can be obviated.

Figure 6:
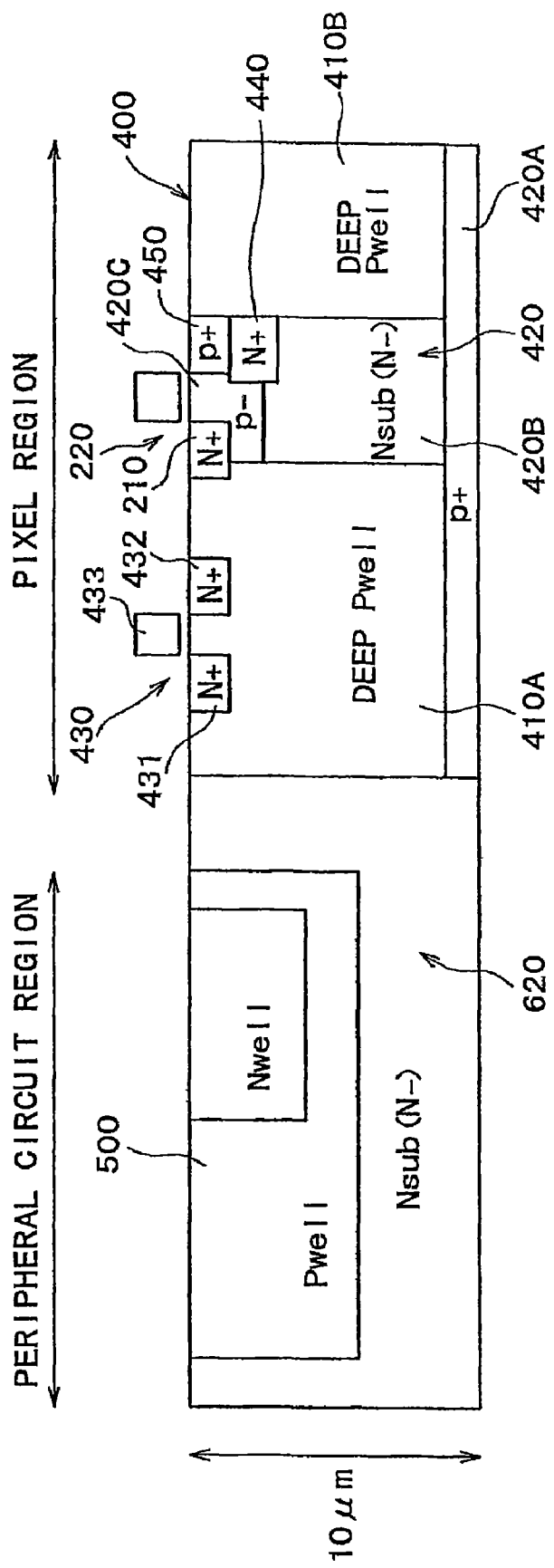
FIG. 6—is a sectional view showing somewhat in detail the device structure in the back-illuminated type CMOS image sensor shown in FIG. 1.

FIG. 6 is a sectional view showing somewhat in detail the well structure in the above-mentioned N type silicon layer 620. Incidentally, in the device structure shown in FIG. 6, the upper side of the figure is the wiring side (face side) and the lower side is the illuminated side (back side), oppositely to FIG. 5. In addition, the elements common in both FIGS. 5 and 6 are denoted by the same symbols as before, and description thereof is omitted.

As for the MOS transistor 500 in the peripheral circuit portion, the same contents as in FIG. 5 are shown, but a low-concentration N− type is used for the N type silicon layer (silicon substrate) 620 as shown in the figure.

On the other hand, as for the pixel 400 in the image pickup pixel portion, a MOS transistor 430 other than the transfer transistor (namely, in this embodiment, an amplification transistor, a reset transistor, or an address transistor) is shown in addition to the contents of FIG. 5.

As described above, the pixel 400 has a structure in which deep P type well regions 410A and 410B are provided in the state of piercing through the silicon layer 620, and a photodiode 420 is provided in the state of piercing through the silicon layer 620 at an intermediate portion therebetween.

The photodiode 420 is comprised of a shallow P+ type layer 420A (a part of a P+ type region 630) on the illuminated side, an N− type layer 420B (a part of the silicon layer 620) in the inside thereof, and a deep P− type well region 420C on the wiring side, and an FD portion 210 and a transfer transistor 220 are formed in the P-well region 420C on the wiring side.

In addition, the N− type layer 420B is the photo-electric conversion region, which has been completely depleted because the area is small and the concentration is low.

An N+ type region 440 for accumulating signal charges is formed at a part of a boundary portion between the N− type layer 420B and the P− type well region 420C. In addition, a P+ type region 450 for forming an embedded photodiode is provided on the wiring side, adjacently to the N+ type region 440.

The signal charge is transferred to an N+ type region of the FD portion 210 by an action of the transfer transistor 220. In addition, under the condition where the transfer transistor 220 is OFF, the N+ type regions on the photodiode 420 side and on the FD portion 210 side are electrically separated from each other by the P− type well region 420C present therebetween.

Besides, the MOS transistor 430 other than the transfer transistor 220 is formed in the deep P type well region 410A as usual, and has a structure in which N+ type source/drain regions 431 and 432 are formed in the P type well region 410A, and a gate electrode 433 is formed on the upper side thereof.

Next, a method of producing the CMOS image sensor constituted as above will be described.

FIGS. 7 to 10 are sectional views showing the process for producing the CMOS image sensor according to this embodiment.

(1) Device Separation, and Formation of Wells

First, device separation regions and various well regions are formed in a silicon substrate (silicon layer 630) before being converted into a thin film. Here, as above-mentioned, a deep P type well region is formed in the pixel portion, and a shallow P type well region and an N type well region are formed in the peripheral circuit portion.

(2) Formation of Various Transistors, Wirings, and Pads

As shown in FIGS. 7(A) and 7(B), various MOS transistors, aluminum wirings, electrode pads and the like are formed in steps similar to the related-art process for producing a CMOS image sensor. In the present embodiment, a registration mark for a stepper is formed by use of a gate or an active region of the MOS transistor.

Incidentally, as a proposal precedent to the present application, there has been proposed a method in which, for conducting registration of the stepper on the back side in the subsequent step, a trench (groove) is formed in the wafer at this stage, and tungsten, aluminum or the like is deposited into the trench to form a mark. In this method, the registration mark can be formed at a deep position in the substrate, or a position near to the back side, but impurities such as metallic atoms would easily enter into the substrate at the mark location. In that case, a defect would be generated in the pixel with a certain probability, and a white spot would appear in an image picked up by the solid state image pickup device. Obviously, these results are undesirable and the previously proposed solution is not practical.

In view of this, in the present embodiment, a registration mark 700 is formed by diverting a gate electrode (polysilicon) or an active region formed for the MOS transistor. Particularly in the active region, it is preferable to form the registration mark of a silicide (a compound of a metal and silicon) such as cobalt silicide.

Besides, in this case, the silicide film can be left on the photodiodes (the side opposite to the illuminated side). Accordingly, a step of removing the silicide film can be omitted, and steps can be simplified. In addition, the defects (appearance of white spots on the picked-up picture) due to the removal step can be prevented.

Besides, it is possible to prevent the problem that the light incident from the back side is transmitted through the photodiode and reflected by the wirings, to be subjected to photoelectric conversion at other photodiodes.

(3) Adhesion of Substrate Support Material

As shown in FIG. 7(C), a glass material is made to flow onto the wiring side, to form a substrate support material (more in detail, a first layer of the substrate support material) 600A. Incidentally, in this case, a resist 710 is patterned on the position where a pad 722 is to be formed.

(4) Formation of Pad and Contact

Figure 8D:
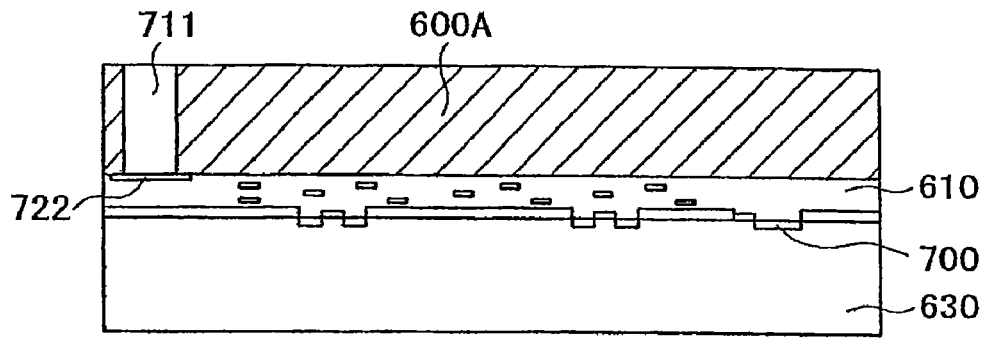
FIGS. 8(D), 8(E), and 8(F)—show sectional views showing the production process of the back-illuminated type CMOS image sensor shown in FIG. 1.
Figure 8E:
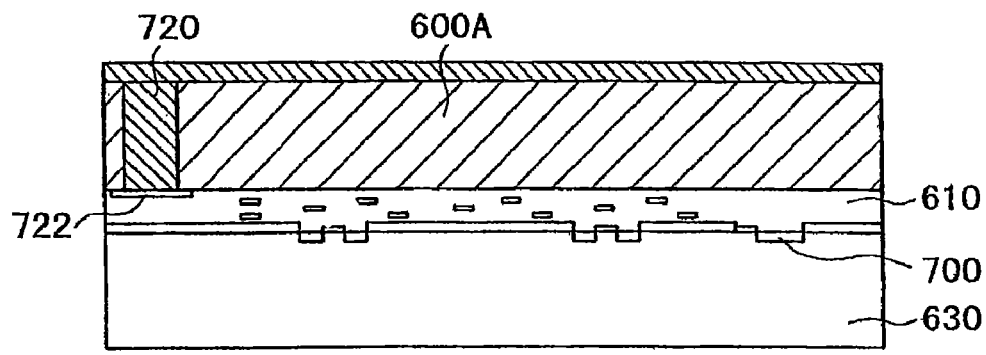
Figure 8F:
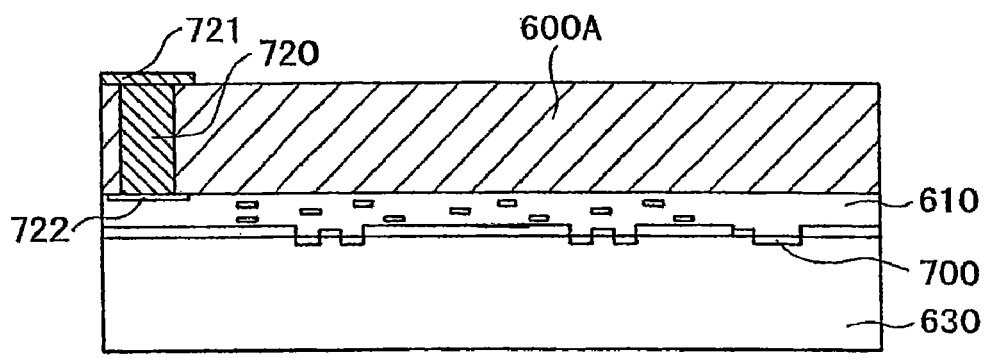

As shown in FIG. 8(D), to form a contact, the resist 710 is removed, a hole 711 is opened in the substrate support material 600A, and a surface treatment is conducted, to expose a bump for connection. Then, as shown in FIG. 8(E), a metal for contact is introduced to the hole 711 and the surface of the substrate support material 600A, to form the contact 720, and, as shown in FIG. 8(F), the metallic film on the surface of the substrate support material 600A is patterned, to form an electrode pad 721.

Thereafter, as shown in FIG. 9(G), a second layer of substrate support material 600B for flattening on the wiring side is made to flow onto the first layer of substrate support material 600A, followed by polishing.

(5) Back Side Polishing

Thereafter, the wafer is inverted face side back, and the back side is polished by CMP until the film thickness of the silicon layer 630 becomes about 10 μm.

(6) Formation of Back-Side Silicon Oxide Film

For example, by CVD (chemical vapor deposition), a thin silicon oxide film ($SiO_2$) 640A (a part of the silicon oxide film 640) is formed in a film thickness of about 10 nm, for example.

Here, as shown in FIG. 9(G), in registry with the registration mark 700 formed of the gate layer or the silicide-added active region formed on the wiring layer side, a registration mark 730 is formed in the back-side silicon oxide film 640. This is formed by etching, in the manner of slightly grinding, the silicon oxide film 640A to the silicon layer 630.

Incidentally, the formation of this back-side registration mark 730 is not indispensable, as will be described later.

(7) Back-Side P+ Implantation

Next, boron in such an amount as to fill up the interface of the silicon oxide film with positive holes is added by ion implantation through the silicon oxide film 640.

Incidentally, in the proposal precedent to the present application, the registration of the stepper has been conducted by use of a registration mark consisting of the trench preliminarily formed in the surface of the wafer as described above. In the present exemplary embodiment, registration can be conducted by either of the following methods.

"A": The registration mark 700 of the gate layer or the active region formed in (2) above is used.

"B": The registration mark 730 formed in the silicon oxide film in (6) above is used.

Therefore, in the case of using the method "A", the formation of the registration mark 730 in "B" can be omitted.

Incidentally, in detecting the registration mark 700 on the wiring side (face side) by the method "A", use of red light or near infrared rays with a wavelength of 0.61 to 1.5 μm makes it possible to enhance the detection efficiency.

(8) Formation of Back-Side Silicon Oxide Film

Next, the residual silicon oxide film 640B is formed by CVD, in a film thickness of 500 nm, for example.

(9) Formation of Back-Side Light-Shielding Film

Subsequently, a light-shielding film 650 of aluminum, tungsten or the like is formed by the CMOS process.

In this case, registration is conducted by the method "A" or "B" described in (7) above. Here, a registration mark (not shown) for a color filter and a micro-lens which will be formed in the subsequent step is formed.

(10) Formation of Passivation Film

A plasma SiN film 660 is formed by CVD (FIG. 9(H)).

Figure 10I:
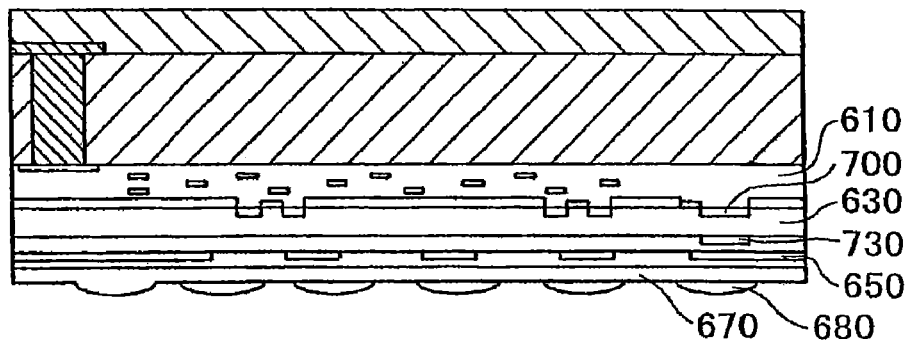
FIGS. 10(I) and 10(J)—show sectional views showing the production process of the back-illuminated type CMOS image sensor shown in FIG. 1.

(11) Formation of Color Filter 670 and Micro-Lens 680 (OCL) (FIG. 10(I))

The steps (10) and (11) above are conducted by the same method as in the related art.

However, the stepper registration is conducted by use of the mark formed in (9). In addition, in the case where the light-shielding film is not used, it is conducted by use of the method "A" or "B" described in (7).

(12) Exposure of Pad Surface

Figure 10J:
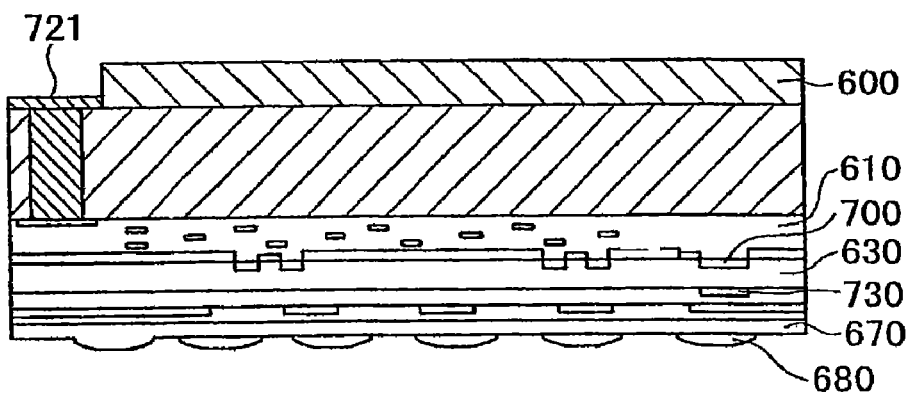
Figure 11:
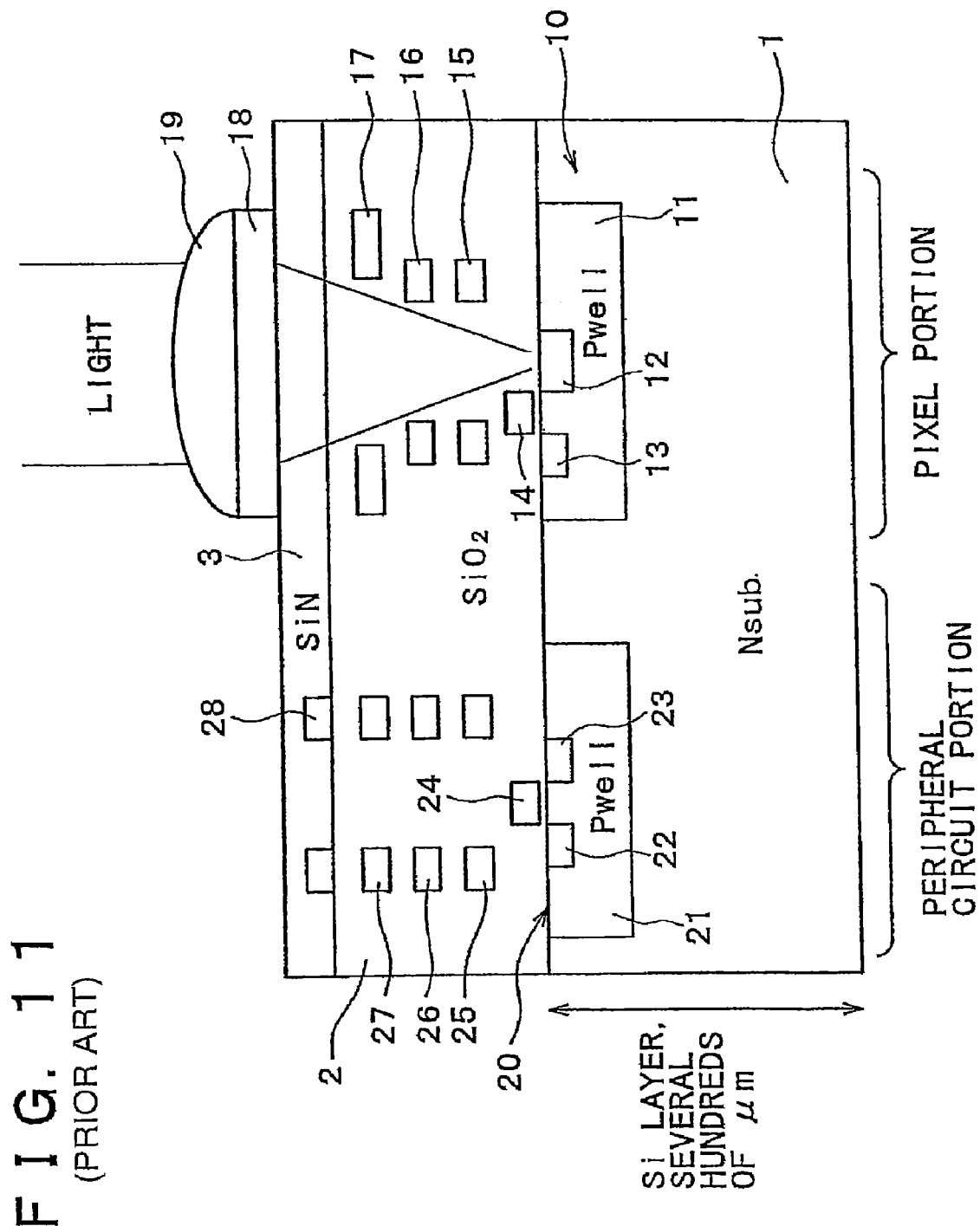
FIG. 11—is a sectional view showing the device structure in a CMOS image sensor according to a related art.
Figure 12:
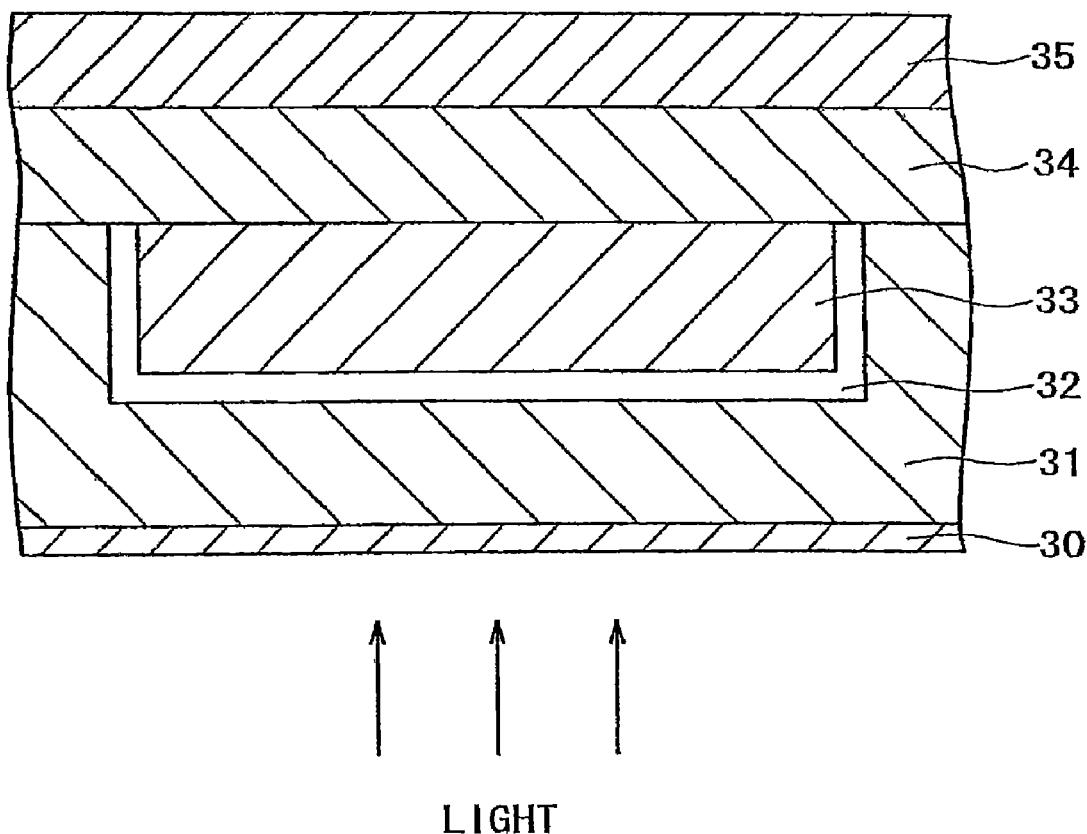
FIG. 12—is a sectional view showing the device structure of a photodiode portion in the back-illuminated type solid state image pickup device shown in FIG. 11.

Next, as shown in FIG. 10(J), the second layer of substrate support material 600B on the electrode pad 721 mentioned above is removed by etching, to expose the electrode pad 721. In this case, the second layer of substrate support material 600B for, for example, registration of the micro-lens and flattening of the device chip is polished to adjust the thickness thereof to a predetermined thickness. Besides, since the portion of the electrode pad 721 is present on the side opposite to the light-receiving side, direct mounting onto the substrate is possible.

As has been described above, in the method of producing a CMOS image sensor according to the present exemplary embodiment, the register mark is formed on the wiring layer side of the silicon substrate by use of the gate layer or the active region, and the registration mark is used for registration of the light-shielding film or the color filter or the on-chip lens on the back side, or the register mark is formed on the back side based on the gate layer or the silicide-containing active region on the wiring layer side, and the registration mark is used for positioning or registration of the light-shielding film or the color filter or the on-chip lens on the back side.

Therefore, since it is unnecessary to form the registration mark for the back side in a special step, the steps are simplified, and it is possible to prevent the problem that impurities such as metallic atoms would enter into the substrate through the registration mark portion to generate defects.

In addition, particularly by forming the active region of a silicide such as cobalt silicide, it becomes easy to detect the mark from the back side. Besides, in confirming the registration mark on the wiring side from the back side, use of red light or near infrared rays with a wavelength of 0.61 to 1.5 μm make it easy to confirm the mark location.

In addition, by not removing the silicide in the active region on the photodiodes, the number of steps is reduced, the steps are simplified, defects associated with the removal step can be reduced, and, further, it is possible to prevent the problem that the light incident from the back side is transmitted through the photodiode and reflected to be subjected to photo-electric conversion by other photodiodes.

By such a technique, a back-illuminated type CMOS image sensor with less defects and good characteristics can be produced by a reduced number of steps.

Besides, the back-illuminated type CMOS image sensor produced by the present embodiment has the following additional advantages.

First, the photodiodes are made to be capable of receiving visible rays from the back side, whereby it becomes unnecessary to provide wirings while taking into account the receiving surfaces as in the related art. Therefore, the degree of freedom of the wirings for the pixels is enhanced, and miniaturization of the pixels can be contrived.

In addition, since the photodiodes reach the back side, sensitivity for blue color for which absorptivity is high is enhanced, and since photo-electric conversion does not occur at portions deeper than the photodiodes, mixing of colors and erroneous detection of black level due to such a photo-electric conversion at deeper portions are obviated.

Besides, since the light-shielding film, the color filter and the on-chip lens can be formed at lower positions than the light receiving surfaces, the problems of lowering of sensitivity, mixing of colors, and light reduction at peripheral areas can be solved.

In addition, the CMOS image sensor can be produced by an advanced CMOS process with a large number of wiring layers.

Furthermore, since the electrode pads are disposed on the side opposite to the light receiving surfaces, they can be mounted directly on the substrate with the light receiving surfaces directed up.

While the specific exemplary embodiment of the present invention has been described above, this is merely one example of the present invention, and various modifications of the present invention are possible.

For example, the specific numerical values of film thickness and the like, materials and the like shown in the above-described exemplary production steps are not to be construed as limitations for the present invention. In addition, the structure of the solid state image pickup device produced is not limited to the above embodiment. For example, the structure of the pixel is not only the one comprised of four MOS transistors, but may be one comprised of three MOS transistors or may be one comprised of five MOS transistors. Besides, the wiring structure for driving the pixels and the like are naturally not limited to the above embodiment.

As has been described above, according to the method of producing a solid state image pickup device according to the present invention, the registration mark is formed by use of an active region or a gate layer for the field effect transistors arranged on the wiring side (first side) opposite to the illuminated side of the semiconductor substrate, whereby the registration of each device on the second side which is difficult to achieve by use of the metallic wiring layers in the related art can be conducted by detecting the registration mark formed on the first side of the semiconductor substrate through the thin film semiconductor substrate. Therefore, the registration of each device can be conducted easily and appropriately, without applying any special registration means to the second side of the semiconductor substrate, and production efficiency and device accuracy are improved.

We claim:

1. A solid state image pickup device comprising:
   a semiconductor substrate having a pixel region and a peripheral circuit region, the pixel region including a photo-electric conversion device and a pixel to detect a black level;
   a wiring layer over a first surface side of the semiconductor substrate, the first surface being opposite to a light receiving surface;
   a light-shielding film over the light receiving surface of the semiconductor substrate to cover the pixel to detect the black level in the pixel region and the peripheral circuit region, the light-shielding film having an opening over the photo-electric conversion device,
   wherein the opening is not formed over the pixel to detect the black level.

2. The device of claim 1, wherein the photo-electric conversion device is a photodiode including a backside layer of a first conductivity type in the light receiving surface, a photo-electric conversion region of a second conductivity type, and a first region of the first conductivity type in the first surface.

3. The device of claim 2, further comprising:
   a charge accumulation region between said photo-electric conversion region and said first surface side.

4. The device of claim 1, further comprising:
   a second region of the first conductivity type adjacent to the photo-electric conversion device; and
   a well of the first conductivity type extending into the semiconductor substrate from the first surface side, the well being in physical contact with the second region.

5. The device of claim 3, wherein the wiring layer includes a gate electrode of a transfer transistor, and the first region is disposed below the gate electrode in the semiconductor substrate.

6. The device of claim 5, further comprising:
   a FD region of the second conductivity type adjacent to the first region.

7. The device of claim 6, wherein the charge accumulation region and the FD region are electrically separated when the transfer transistor is OFF.

8. The device of claim 6, wherein the signal charge is transferred to the FD region when the transfer transistor is ON.

9. The device of claim 1, wherein said wiring layer includes a plurality of wirings within an oxide layer.

10. The device of claim 9, wherein in the peripheral circuit region, a first well region of a first conductivity type is formed on the first surface side in the semiconductor substrate, and a source and drain are formed in the first well region and a gate electrode is formed in the wiring layer.

11. The device of claim 10, wherein the gate electrode includes a polysilicon film and is formed within the oxide layer of said wiring layer.

12. The device of claim 1, further comprising:
   an oxide layer over the light receiving surface of said semiconductor substrate; and
   a backside layer in the light receiving surface side of the semiconductor substrate,
   wherein the backside layer functions to accumulate holes on an interface between the oxide layer and the semiconductor substrate.

13. The device of claim 12, wherein the backside layer is formed through the oxide layer.

14. The device of claim 1, wherein electrodes and wirings are within said wiring layer.

15. The device of claim 1, wherein said photo-electric conversion region is configured to convert a spectrum of the incident light into a signal charge.

16. The device of claim 15, wherein the thickness of said semiconductor substrate correlates to said spectrum.

17. The device of claim 2, wherein said photo-electric conversion region is in physical contact with said backside layer.

18. The device of claim 1, wherein said wiring layer is between said semiconductor substrate and a substrate support member.

* * * * *